(12) United States Patent
Yoshida et al.

(10) Patent No.: US 7,846,766 B2
(45) Date of Patent: Dec. 7, 2010

(54) DIAMOND FILM FORMATION METHOD AND FILM FORMATION JIG THEREOF

(75) Inventors: Hiroaki Yoshida, Yokohama (JP); Isamu Yanase, Yokohama (JP); Tomio Ono, Yokohama (JP); Naoshi Sakuma, Yokohama (JP); Mariko Suzuki, Yokohama (JP); Tadashi Sakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 968 days.

(21) Appl. No.: 11/674,354

(22) Filed: Feb. 13, 2007

(65) Prior Publication Data

US 2007/0218660 A1    Sep. 20, 2007

(30) Foreign Application Priority Data

Mar. 14, 2006    (JP) .............................. 2006-069496

(51) Int. Cl.
*H01L 21/00* (2006.01)
(52) U.S. Cl. .................... 438/105; 438/758; 427/249.7; 427/249.8
(58) Field of Classification Search ................. 438/105, 438/758; 427/249.7, 249.8
See application file for complete search history.

(56) References Cited

U.S. PATENT DOCUMENTS

| 4,919,974 | A | * | 4/1990 | McCune et al. | .......... 427/249.7 |
| 5,449,531 | A | * | 9/1995 | Zhu et al. | ................. 427/249.8 |
| 5,499,601 | A | * | 3/1996 | Imai et al. | ...................... 117/84 |
| 5,792,556 | A | * | 8/1998 | Ishikura et al. | ............. 428/408 |
| 5,880,559 | A | | 3/1999 | Fox et al. | |

FOREIGN PATENT DOCUMENTS

| JP | 9-48694 | 2/1997 |
| JP | 11-199378 | 7/1999 |
| JP | 2002-298777 | 10/2002 |
| JP | 2003-132850 | 5/2003 |
| JP | 2006-56744 | 3/2006 |

* cited by examiner

*Primary Examiner*—Brook Kebede
(74) *Attorney, Agent, or Firm*—Oblon, Spivak, McClelland, Maier & Neustadt, L.L.P.

(57) ABSTRACT

A diamond film formation method includes forming, in a composite of a metal material and a semiconductor material, diamond nuclei on a surface of the metal material at a temperature below 650° C. in a first mixed gas containing at least carbon and hydrogen, and growing the diamond nuclei formed in the composite at a temperature below 750° C. in a second mixed gas containing at least carbon and hydrogen to form a diamond film.

16 Claims, 8 Drawing Sheets

DIAMOND FILM FORMATION METHOD AND FILM FORMATION JIG THEREOF

CROSS-REFERENCE TO RELATED APPLICATIONS

This application is based upon and claims the benefit of priority from prior Japanese Patent Application No. 2006-069496, filed Mar. 14, 2006, the entire contents of which are incorporated herein by reference.

BACKGROUND OF THE INVENTION

1. Field of the Invention

The present invention relates to a diamond film formation method and a film formation jig thereof, and more particularly, it relates to a film formation technique for forming a diamond film on an interior surface of a metal material comprising a hollow body and a recess.

2. Description of the Related Art

Diamond has a bandgap of about 5.5 eV at room temperature, and has good semiconducting properties and optical properties in addition to mechanical, chemical and thermal properties, and attention is therefore focused on diamond as a semiconductor material.

As techniques using diamond as a semiconductor material, for example, cold cathode discharge devices have been disclosed (refer to JP-A 2002-298777 (KOKAI) and JP-A 2003-132850 (KOKAI)). In these techniques, diamond with high secondary electron emission efficiency and high resistance to sputtering can be used to provide cold cathode discharge devices with high luminous efficiency and longer lives. These cold cathode discharge devices have simple structures without heating filaments, are easily reduced in size, can be used at a low temperature and have comparatively long lives, such that they are widely used for illumination, backlights of liquid crystal devices, etc.

Furthermore, in order to improve the efficiency in secondary electron emission from the surface of diamond, there has been disclosed an electrode made of a metal material in which a diamond layer is formed on a cup-shaped or tubular interior surface (e.g., refer to U.S. Pat. No. 5,880,559).

However, when a diamond film is to be formed on the interior surface of the cup-shaped or tubular metal material, a thick film of diamond tends to be formed in an outer peripheral portion of the metal material if the CVD method is used, and it has thus been difficult to form a diamond film on the interior surface of the cup-shaped or tubular metal material.

As described above, it is desirable that, as a cold cathode used in the cold cathode discharge device, a diamond film be formed on the interior surface of the cup-shaped or tubular metal material to improve the efficiency in the secondary electron emission from the surface of diamond, but it has been difficult in principle to form a diamond film only on the interior surface by the CVD method. Therefore, it has been desired to develop a film formation method which makes it possible to efficiently form a film of diamond on the interior surface of the cup-shaped or tubular metal material.

BRIEF SUMMARY OF THE INVENTION

According to a first aspect of the invention, there is provided a diamond film formation method, which includes:

forming, in a composite of a metal material and a semiconductor material, diamond nuclei on a surface of the metal material at a temperature below 650° C. in a first mixed gas containing at least carbon and hydrogen; and growing the diamond nuclei formed in the composite at a temperature below 750° C. in a second mixed gas containing at least carbon and hydrogen to form a diamond film.

According to a second aspect of the invention, there is provided a diamond film formation method, which includes:

by providing a semiconductor material on an opening edge on one surface of a metal material in which an opening is formed, forming diamond nuclei on an interior surface of the opening at a temperature below 650° C. in a first mixed gas containing at least carbon and hydrogen; and growing the diamond nuclei formed on the metal material at a temperature below 750° C. in a second mixed gas containing at least carbon and hydrogen to form a diamond film.

According to a third aspect of the invention, there is provided a film formation jig, which includes:

a support table;

a holder mounted on the support table and having at least one first opening; and a mask member mounted on the holder and having a second opening with an inside dimension shorter than an inside dimension of the first opening.

DETAILED DESCRIPTION OF THE INVENTION

Embodiments of the present invention will hereinafter be described with reference to the drawings. In the following description of the drawings, the same or similar numerals are assigned to the same or similar parts. It is to be noted that the drawings are schematic and that the relation between the thickness and planar dimensions, the ratio of the thickness of layers, etc., are different from real ones. Therefore, the following description should be considered to judge specific thickness and dimensions. It should also be understood that the drawings include parts in which the relation and ratio of dimensions are different with each other.

Before describing the embodiments of the present invention, the outline of the present invention will be described. In order to form a diamond film on a base material made of a substance other than diamond, it is necessary to generate diamond nuclei on a film formation surface thereof. Known methods of generating diamond nuclei include a substrate scratching method and a plasma CVD method.

The substrate scratching method is a method in which diamond powder is physically attached on a base material by scratching. Another method is known in which a base material is immersed in a suspension of diamond and diamond is attached on the base material by a supersonic treatment. However, both of the methods have accidental natures, and require much know-how to bring the state of the surfaces of the base materials into the same state with good reproducibility.

In the plasma CVD method, a method called a bias treatment is used wherein an electric field is applied across plasma and the base material to generate diamond nuclei. The use of this method permits a diamond film to be also formed on a base material made of a substance other than diamond.

As a result of conducting experiments, the present inventors have found a manufacturing condition wherein when diamond films are to be formed on a metal material made of, for example, Mo and on a semiconductor base material made of, for example, silicon, the condition of the bias treatment and the condition of subsequent diamond film formation can be controlled such that a diamond film is formed only on the metal material or on the semiconductor base material in the same process of the plasma CVD method.

Figure 15:
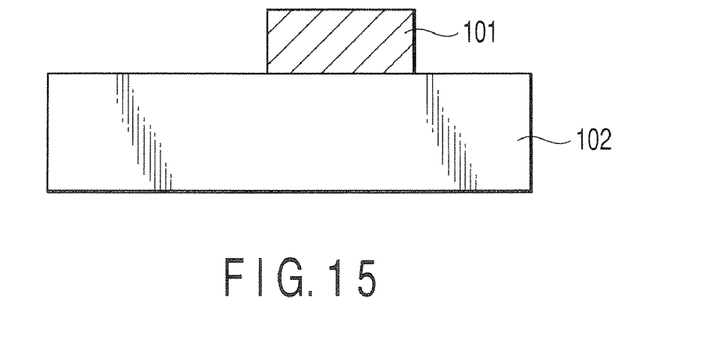
FIG. 15 is a conceptual diagram for explaining the diamond film formation method of the present invention.
Figure 16:
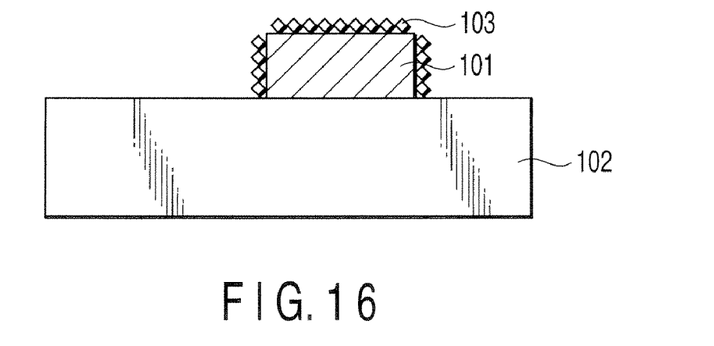
FIG. 16 is a conceptual diagram for explaining the diamond film formation method of the present invention.

More specifically, as shown in FIG. 15, it has been confirmed that when the bias treatment is conducted for a composite of a metal material 101 and a semiconductor material 102 (the metal material 101 is provided on the semiconductor material 102 in FIG. 15) at a temperature below 650° C. in a first mixed gas containing at least carbon and hydrogen, diamond nuclei 103 are not formed on the semiconductor material 102, but the diamond nuclei 103 are formed only on the metal material 101, as shown in FIG. 16.

Figure 17:
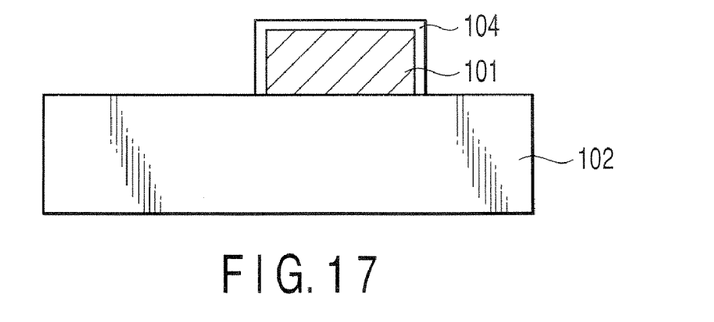
FIG. 17 is a conceptual diagram for explaining the diamond film formation method of the present invention.

Subsequently, it has been confirmed that when a diamond film is formed for this composite at a temperature below 750° C. in a second mixed gas containing at least carbon and hydrogen, the diamond nuclei 103 are not formed on the semiconductor material 102, but a uniform diamond film 104 is formed on the metal material 101, as shown in FIG. 17.

On the basis of the manufacturing mechanism described above, the present inventors have succeeded in finding a diamond film formation method which makes it possible to suitably form a diamond film on an interior surface of a cup-shaped or tubular metal material.

Embodiment of Diamond Film Formation Method

Figure 1A:
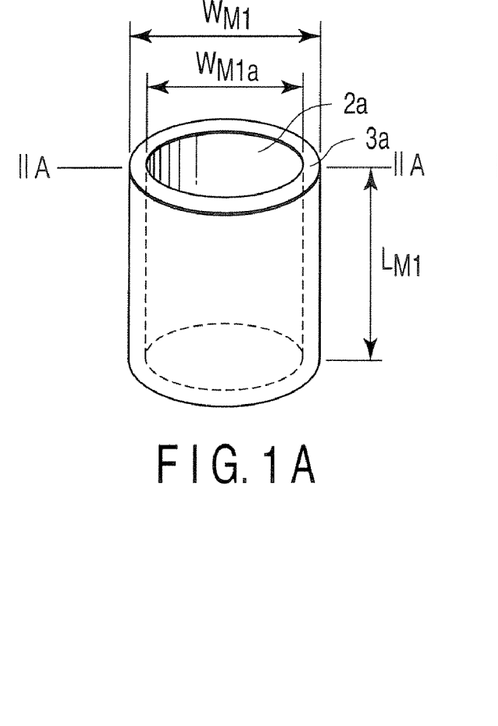
FIGS. 1A and 1B are perspective views showing forms of film formation target base materials used in the present invention.
Figure 1B:
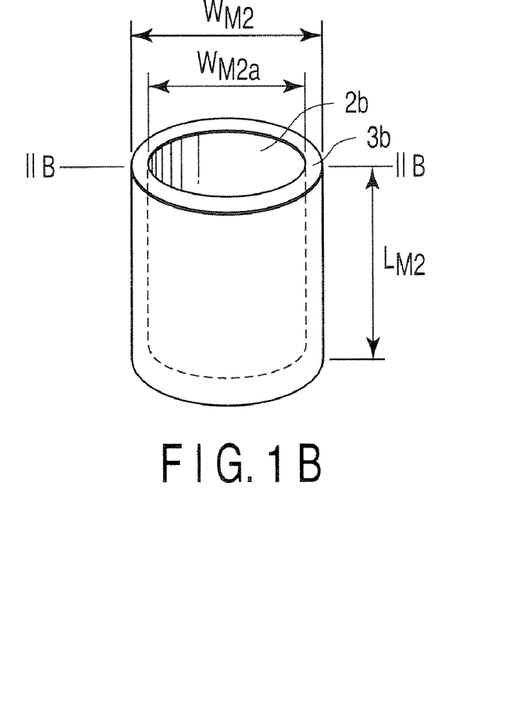
Figure 2A:
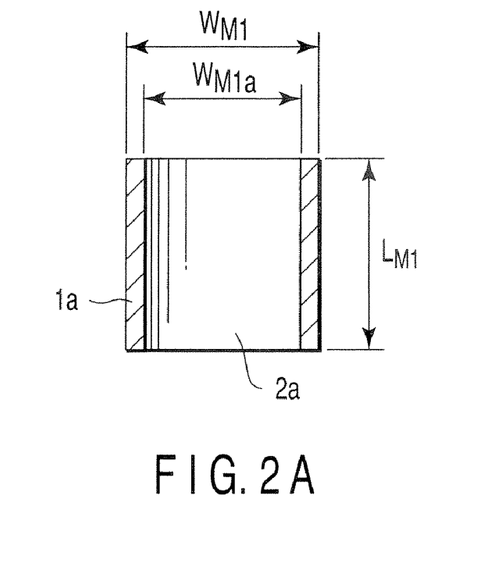
FIGS. 2A and 2B are sectional views along the lines IIA-IIA and IIB-IIB of FIG. 1.
Figure 2B:
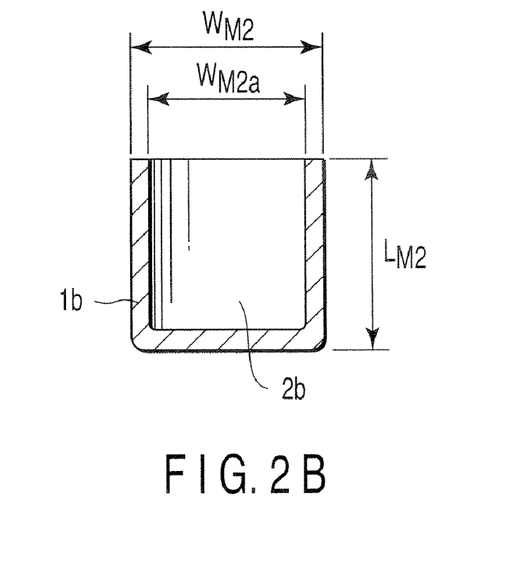

First, a diamond film formation method according to the present invention will be described. FIGS. 1A and 1B are perspective views showing forms of film formation target base materials used in the present invention. FIGS. 2A and 2B are sectional views along the lines IIA-IIA and IIB-IIB of FIGS. 1A and 1B.

As the film formation target base materials used in the present invention, use is made of a tubular metal material 1a as shown in FIGS. 1A and 2A, and a cup-shaped metal material 1b as shown in FIGS. 1B and 2B. Diamond films are formed on interior surfaces of openings 2a and 2b of these metal materials 1a and 1b.

Figure 3:
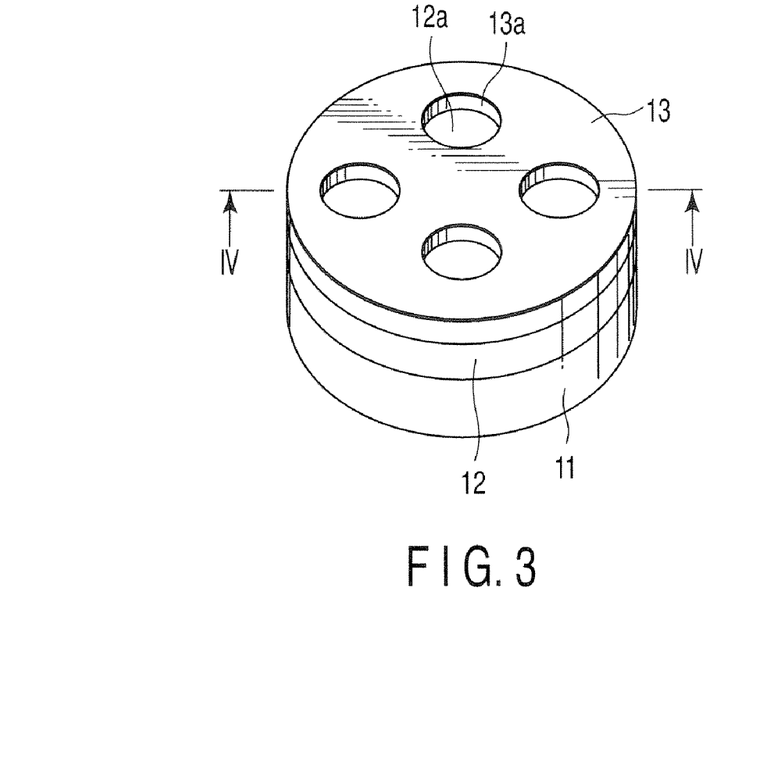
FIG. 3 is a perspective view of a film formation jig used in a diamond film formation method of the present invention.
Figure 4:
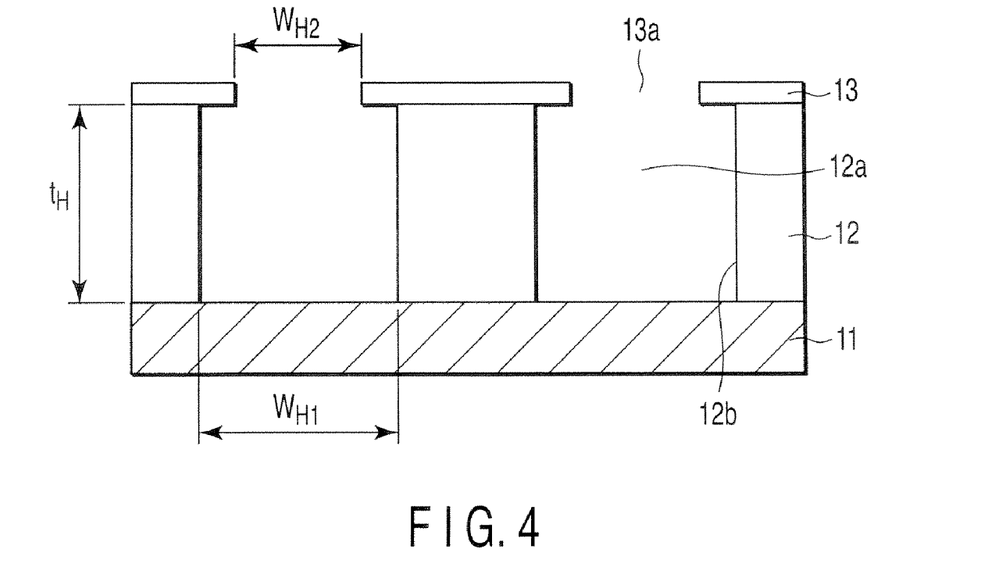
FIG. 4 is a sectional view along the line IV-IV of FIG. 3.

Next, a film formation jig is shown in FIGS. 3 and 4 which is used when forming the diamond films on the interior surfaces of the openings 2a and 2b of the metal materials 1a and 1b. FIG. 3 is a perspective view of the film formation jig used in the diamond film formation method of the present invention. FIG. 4 is a sectional view along the line IV-IV of FIG. 3.

As shown in FIGS. 3 and 4, the film formation jig used in the diamond film formation method of the present invention comprises a support table 11, a holder 12 and a mask member 13. The support table 11 is made of a metal material such as Mo, and has a plate shape or column shape. The support table 11 is not specifically limited in thickness, but is configured to be, for example, about 10 mm.

The holder 12 is mounted on the support table 11, and comprises at least one opening 12a (first opening) (four openings in FIG. 3). The holder 12 is made of a semiconductor material such as silicon (Si).

As shown in FIG. 4, the opening 12a of the holder 12 is designed to have dimensions so that, for example, the metal material 1a or 1b shown in FIGS. 1 and 2 can be housed therein. That is, lengths $L_{M1}$ and $L_{M2}$ of the metal materials 1a and 1b are sized to be the same as thickness $t_H$ of the holder 12, and outside dimensions $W_{M1}$ and $W_{M2}$ of the metal materials 1a and 1b are sized to be the same as an inside dimension $W_{H1}$ of the opening 12a of the holder 12. The thickness $t_H$ of the holder 12 depends on the lengths $L_{M1}$ and $L_{M2}$ of the metal materials 1a and 1b which are the film formation target members, but is designed to be, for example, about 2 to 5 mm.

The mask member 13 is mounted on the holder 12, and comprises an opening 13a (second opening) having an inside dimension $W_{H2}$ shorter than the inside dimension $W_{H1}$ of the opening 12a of the holder 12. The mask member 13 is made of a semiconductor material such as silicon (Si), and the thickness of the mask 13 used is, for example, about 300 to 500 μm.

Next, a method of manufacturing the film formation jig shown in FIGS. 3 and 4 will be described.

First, as the support table 11, a planar substrate made of a metal material such as Mo is prepared. Next, a silicon substrate made of silicon is prepared as the holder 12, and then a plurality of through-holes (openings 12a) which have the inside dimension $W_{H1}$ similar to the outside dimensions $W_{M1}$ or $W_{M2}$ of the metal materials 1a or 1b are formed on the silicon substrate by a supersonic machining method. The silicon substrate in which the plurality of through-openings 12a are formed is mounted on the support table 11. In this case, the support table 11 and the holder 12 only need to be in physical contact, and the holder 12 is mounted on the support table 11 by its own weight. Then, the metal materials 1a and 1b shown in FIGS. 1 and 2 are housed in the openings 12a of the holder 12 so that openings thereof are located vertically over the surface of the support table 11.

Next, a silicon substrate is prepared as the mask member 13, and then the openings 13a having the inside dimension $W_{H2}$ similar to inside dimensions $W_{M1a}$ and $W_{M2a}$ of the metal materials 1a and 1b are formed at positions corresponding to the through-holes (openings 12a) formed in the holder 12 by an etching treatment using, for example, potassium hydroxide. Then, the mask member 13 is mounted on the holder 12 so that outer edges of the formed openings 13a (ends of the openings on one surface of the mask member 13 and in parts where the openings 13a are formed) correspond to outer edges forming the inside dimensions $W_{M1a}$ and $W_{M2a}$ of the metal materials 1a and 1b housed in the openings 12a (ends of the openings which are on one surface of the metal materials 1a and 1b and in which the openings are formed).

Figure 5:
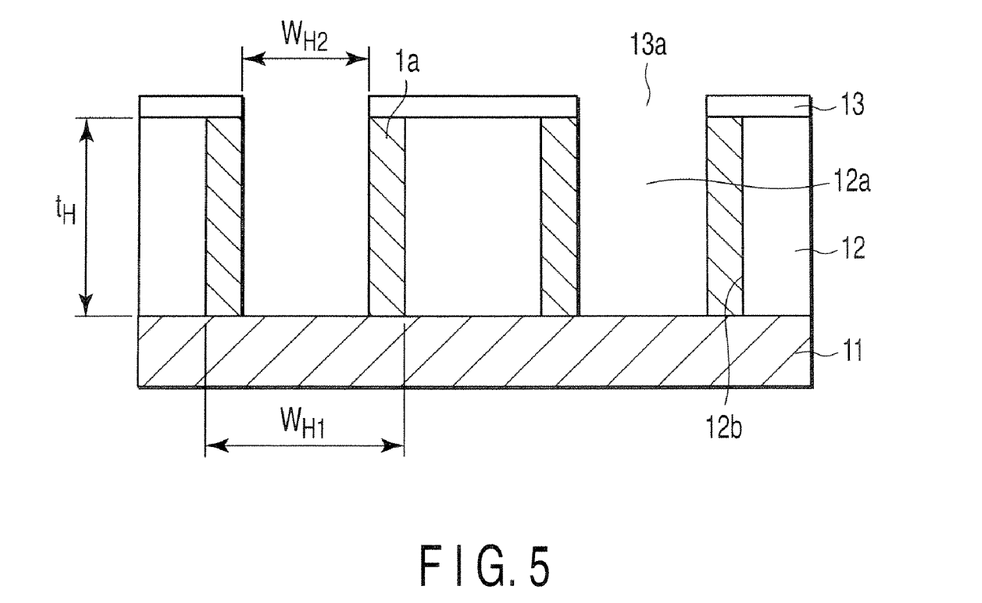
FIG. 5 is a sectional view concerning the film formation jig wherein a tubular metal material 1a shown in FIG. 1 is housed in an opening 12a of a holder 12.

FIG. 5 is a sectional view concerning the film formation jig wherein the tubular metal material 1a shown in FIG. 1 is housed in the opening 12a of the holder 12. As shown in FIG. 5, the metal material 1a which is the film formation jig is housed in the opening 12a of the holder 12 so that the opening 2a of this metal material 1a is exposed vertically over the surface of the support table 11. Further, the metal material 1a has a structure in which the mask member 13 is provided on one surface (hereinafter referred to as an upper end) 3a where the opening 2a of this metal material 1a is formed.

Next, for example, the film formation jig as shown in FIG. 5 housing the metal material 1a is placed in a plasma CVD device (not shown) targeting at diamond, and then a diamond film is formed. At this point, the formation of the diamond film is carried out at two stages. At the first stage, diamond nuclei serving as a source for growing the diamond film are formed on the interior surface of the opening of the film formation member (diamond nuclei formation process).

Figure 6:
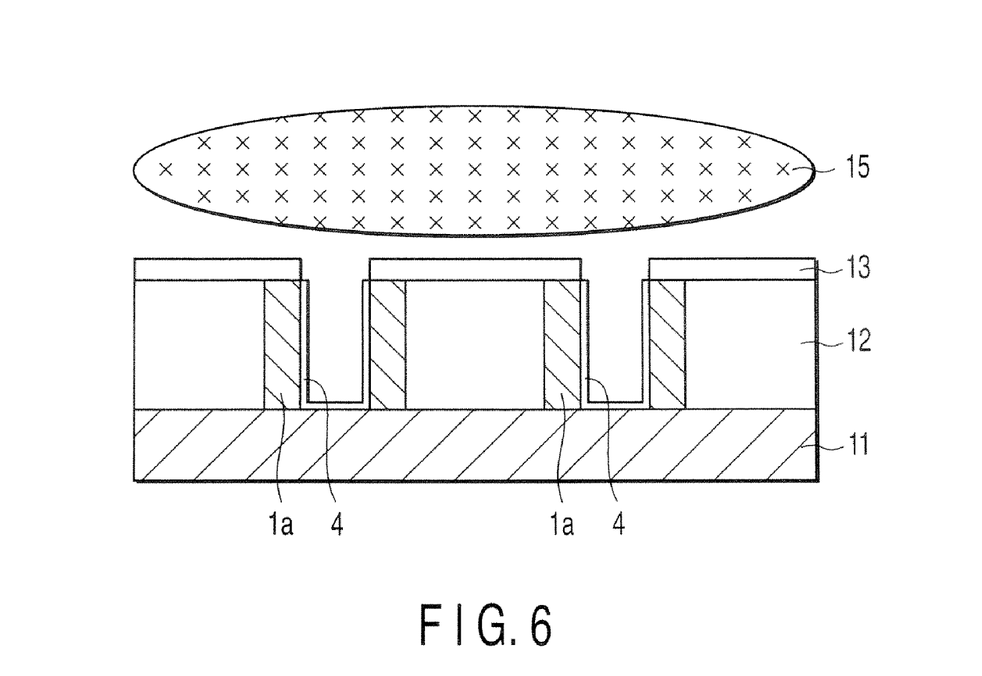
FIG. 6 is a schematic diagram showing how a diamond film is formed when the formation of the diamond film is carried out in a configuration according to the present invention.

Specifically, as shown in FIG. 6, for example, a potential (e.g., about 150 to 300 V) negative with respect to plasma is applied to the support table 11 of the film formation jig housing the metal material 1a, and the metal material 1a housed in the holder 12 is negatively charged to implant positive ions of carbon atoms converted into plasma into the interior surface of the opening 2a of the metal material 1a, thereby generating diamond nuclei. Treatment conditions at this moment are controlled as follows: a temperature (hereinafter simply referred to as a treatment temperature), for example, over the opening 2a of the metal material 1a, that is, over the mask member 13 is, for example, 500° C.; pressure is 6 torr; a mixed gas is $CH_4/(CH_4+H_2)$=0.01 to 0.2 (1 to 20%); and the amount of increased current during the generation of plasma is 10 to 30 mA. Thus, the thermal treatment is carried out for 15 minutes.

The treatment is preferably carried out at a temperature of below 650° C. during this diamond nuclei formation process. If the treatment is carried out at a temperature of below 650° C. during the diamond nuclei formation process, the diamond nuclei are not formed on the surface of the mask member 12, and the diamond nuclei are efficiently formed only on the surface (interior surface) of the opening 2a of the metal material 1a exposed in a reaction space. When the treatment temperature exceeds 650° C., carbon diffuses on the surface layer of the metal material 1a before carbon supplied into the opening 2a of the metal material 1a is formed as diamond nuclei on the interior surface of the metal material 1a, so that the diamond nuclei cannot be efficiently formed on the interior surface of the opening 2a. In addition, the lower limit of the treatment temperature during the diamond nuclei formation process is timely changed in accordance with the size of the metal material 1a, the mixed gas, the pressure in the device, etc., but 400° C. or more is preferable as the treatment temperature to permit the generation of the diamond nuclei.

In addition, the metal material 1a has been described here, but it goes without saying that the same is true for the metal material 1b.

Next, as the second stage, the diamond nuclei formed on the interior surface of the opening 2a are grown, thereby forming a diamond film (diamond film formation process).

Specifically, the treatment temperature is set at 650° C., and microwave power is set at be 1500 W and the mixed gas is controlled so that $CH_4/(CH_4+H_2)$=0.005 to 0.05 (0.5 to 5%), thus carrying out the film formation within 90 minutes.

The treatment is preferably carried out at a temperature of below 750° C. during the diamond film formation process. If the treatment is carried out at a temperature of below 750° C. during the diamond film formation process, the diamond nuclei formed on the interior surface of the opening 2a of the metal material 1a can be efficiently grown to form a diamond film. When the treatment temperature during the diamond film formation process exceeds 750° C., the diamond nuclei are generated on the surface of the mask member 13 made of the semiconductor material. In this case, carbon in the reaction space concentrates on the diamond nuclei generated on the surface of the mask member 13, and carbon is consumed for the growth of the diamond nuclei, so that carbon is not easily supplied to the opening 2a of the metal material 1a and the diamond film cannot be efficiently grown.

That is, carrying out the treatment at a temperature of below 750° C. holds down the generation of the diamond nuclei on the surface of the mask member 13 made of the semiconductor material, and it is therefore possible to efficiently form a diamond film on the interior surface of the opening 2a of the metal material 1a. In addition, the lower limit of the treatment temperature during the diamond film formation process is also timely changed in accordance with the size of the metal material 1a, the mixed gas, the pressure in the device, etc., but 600° C. or more is preferable as the treatment temperature to permit the generation of the diamond nuclei. In addition, the metal material 1a is described here, but it goes without saying that the same is true for the metal material 1b.

When the treatment is carried out in the treatment conditions described above, diamond films of about 2 μm in thickness can be formed only on the interior surfaces of the openings 2a and 2b of the metal materials 1a and 1b.

The pressure in the device during the diamond film formation process is preferably higher than the pressure during the diamond nuclei formation process. When the pressure in the device during the diamond film formation process is thus higher than the pressure in the device during the diamond nuclei formation process, it is possible to further promote the growth of the diamond nuclei formed on the interior surfaces of the openings 2a and 2b of the metal materials 1a and 1b, thereby enabling the efficient formation of the diamond film.

In addition, methane/hydrogen is used as a source gas for the diamond nuclei formation process and the diamond film formation process in the specific example described above, but the present invention is not limited thereto. For example, acetone or methyl alcohol may be heated as the source gas for the diamond film formation process. Moreover, a carrier gas such as hydrogen may be used to bubble acetone or methyl alcohol. The above-mentioned methods can also be used to obtain effects similar to when methane/hydrogen is used. The speed of diamond film formation during the diamond film formation process is proportionate to an atomic weight ratio between hydrogen and carbon, and the diamond film formation speed is not greatly different from that when a methane/hydrogen-based material is used.

Specifically, when hydrogen is used as a carrier gas to bubble acetone ($C_3H_6O$) in the diamond film formation after the diamond nuclei formation process has been conducted with methane/hydrogen in the condition described above, the film formation is possible if a quotient derived when $C_3H_6O$ divided by the atomic sum of acetone ($C_3H_6O$) and a hydrogen gas ($H_2$), that is ($C_3H_6O/(C_3H_6O+H_2)$), is in a range of 0.001 to 0.15 (0.1 to 15%). Other film formation conditions at this moment include a microwave power of 1500 W and a treatment temperature of 650° C. In addition, if the film formation is conduced in a range of $C_3H_6O/(C_3H_6O+H_2)$ =0.002 to 0.02 (0.2 to 2%) in the diamond film formation process, a good diamond film can be formed with a higher growth rate.

Furthermore, when a p-type diamond film is formed in the openings 2a and 2b of the metal materials 1a and 1b, an impurity raw material such as diborane or trimethylboron or trimethyl borate or triethyl borate is mixed. Specifically, a composite in which trimethyl borate is mixed into acetone at 0.2% is heated and evaporated for use as a raw material, and the film formation is carried out under the conditions including a microwave power of 1500 W, a treatment temperature of 650° C. and $C_3H_6O/(C_3H_6O+H_2)$=0.01 (1.0%), such that a polycrystalline diamond film with a specific resistance of $10^3$ Ω/cm can be formed.

Mo has been illustrated as the metal materials 1a and 1b described above, but the present invention is not limited thereto, and it is possible to use W, Co, Ni or, for example, an alloy containing these substances. The tubular or cup shape has been described as the shape of the metal materials 1a and 1b, but the present invention is not limited thereto, and it goes without saying that the present invention can also be applied to metal materials provided with openings having other shape.

In the film formation jig housing the metal materials 1a and 1b, Mo has been illustrated for the support table 11, but the present invention is not limited thereto, and it is possible to use W, Co, Ni or, for example, an alloy containing these substances.

In addition, when the metal materials 1a and 1b are housed in the film formation jig as shown in FIG. 5 to form diamond films on the interior surfaces of the openings 2a and 2b of the metal materials 1a and 1b, a diamond film is also formed on the exposed support table 11 located under the opening 12a of the holder 12. However, there is no problem because this film is separated by lift-off effect when the metal materials 1a and 1b are removed from the film formation jig.

Figure 7:
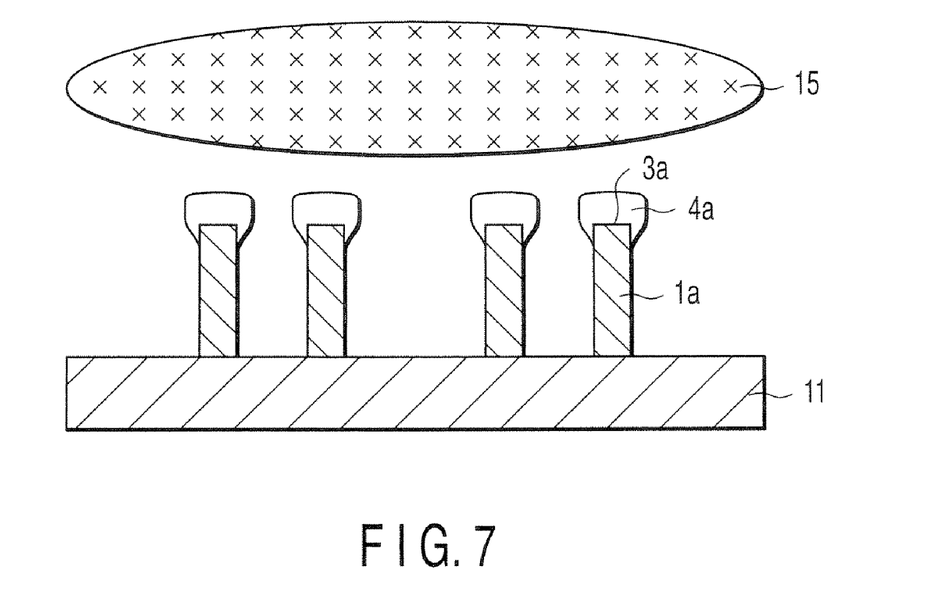
FIG. 7 is a schematic diagram showing how a diamond film is formed in a situation where plasma CVD is carried out without using the holder 12 and a mask member 13.
Figure 8:
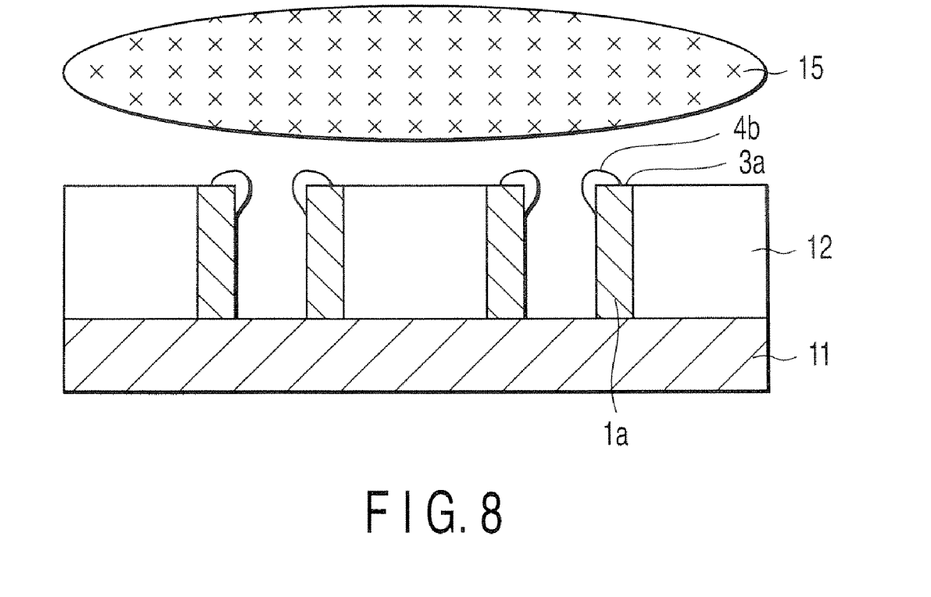
FIG. 8 is a schematic diagram showing how a diamond film is formed in a situation where the plasma CVD is carried out without using the mask member 13.

Here, referring to FIG. 6 to FIG. 9, there will be described effects when the mask member 13 is provided on the upper end 3a of the metal materials 1a and 1b where the openings 2a and 2b are formed. As shown in FIGS. 7 and 8, when a plasma CVD treatment is carried out without using the mask member 13, diamond films 4a and 4b are formed on the upper end 3a of the metal material 1a by plasma 15. If the diamond films 4a and 4b are formed on the upper end 3a of the metal material 1a in this manner, carbon atoms concentrate on the diamond films 4a and 4b and are thus consumed, such that the carbon atoms are not easily supplied to the inside of the opening 2a of the metal material 1a, thus making it difficult to uniformly form a diamond film on the interior surface of the opening 2a of the metal material 1a. This situation holds true with FIG. 9 and is not preferable because a diamond film 4c is formed on the upper end 3a of the metal material 1a which is not provided with the mask member 13.

On the contrary, as shown in FIG. 6, the mask member 13 is provided on the upper end 3a of the metal material 1a in the configuration according to the present invention, and the plasma CVD treatment is carried out in a condition where diamond nuclei are not generated on the surface of the mask member 13, such that a diamond film is not formed over the surface of the mask member 13 including the upper end 3a of the metal material 1a, and a diamond film can be uniformly formed only on the interior surface of the opening 2a of the metal material 1a.

Figure 9:
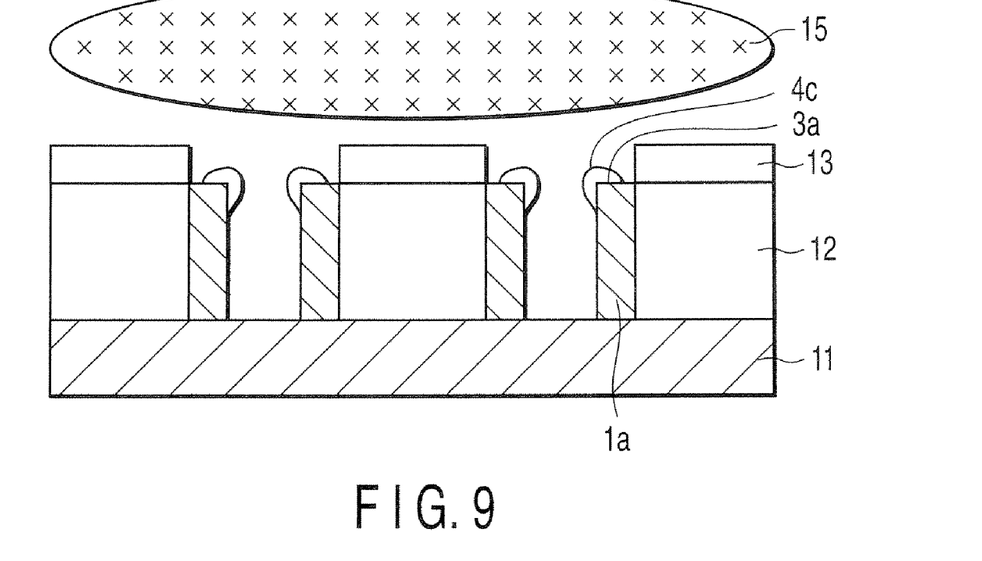
FIG. 9 is a schematic diagram showing how a diamond film is formed when an upper end of the metal material 1a is exposed in a reaction space.

It is preferable that the above-mentioned mask member 13 is equally provided on the upper ends 3a and 3b of the metal materials 1a and 1b. For example, as shown in FIG. 9, when the vicinity of the opening edge at the upper end of the metal material 1a is exposed in the reaction space, the diamond film 4c is undesirably formed in that portion.

Figure 10:
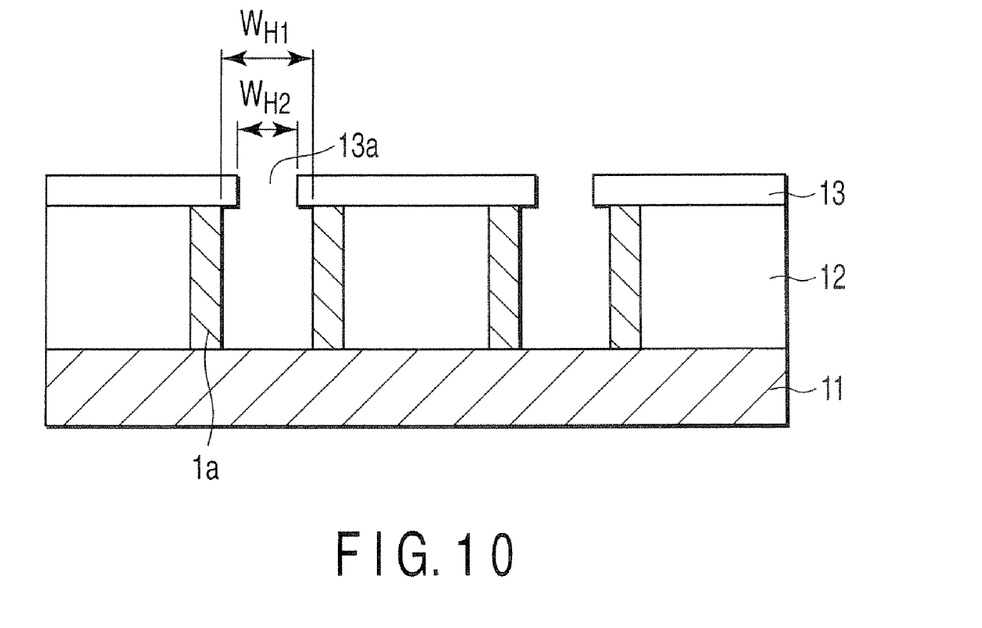
FIG. 10 is a perspective view showing another form of the film formation target base material used in the present invention.

In addition, it is preferable that the mask member 13 is equally provided on the upper end 3a of the metal material 1a, but the mask member 13 may be configured to slightly block the opening 2a of the metal material 1a as shown in FIG. 10 as long as the mask member 13 is equally provided on the upper end 3a of the metal material 1a. That is, concerning the inside dimension $W_{M1a}$ of the opening 2a of the metal material 1a shown in FIG. 10 and the inside dimension $W_{H2}$ of the opening 13a of the mask member 13, similar effects can be obtained even if their inside dimensions are designed to the extent that $W_{H2}$ equals to 0.8 times $W_{M1a}$.

In addition, an example has been described above where the metal material 1a is primarily used, but it goes without saying that similar effects can also be obtained when the cup-shaped metal material 1b is used.

Figure 11:
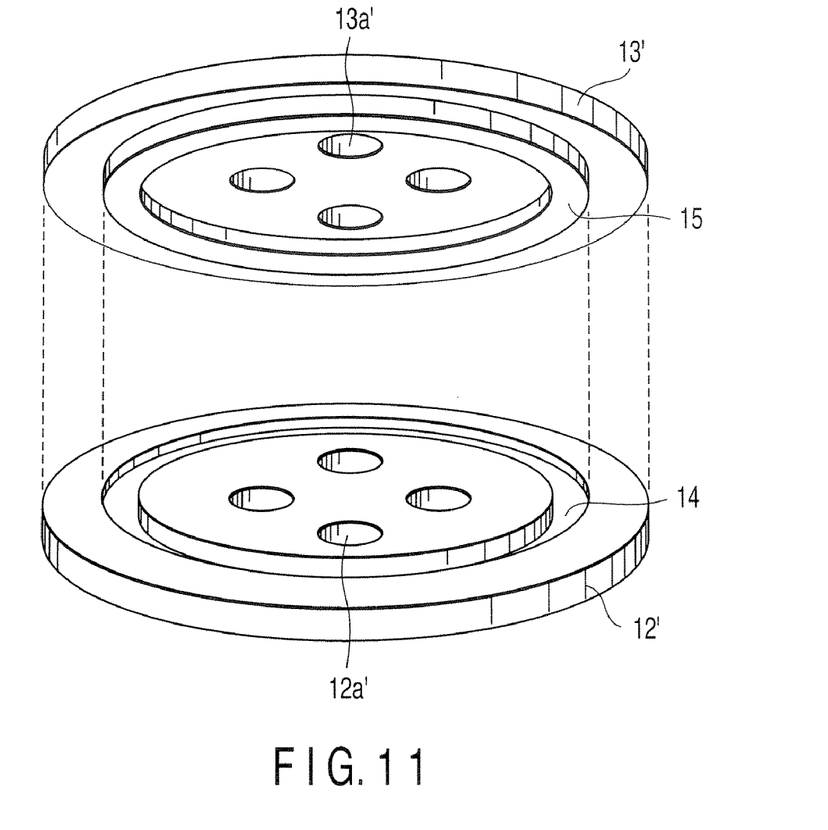
FIG. 11 is a perspective view showing another form of the film formation jig used in the diamond film formation method of the present invention.

Moreover, the holder 12 and the mask member 13 in the film formation jig described above may include a configuration in which a depression 14 is provided on the periphery of openings 12a' of a holder 12' and a protrusion 15 is provided on the periphery of openings 13a' of a mask member 13' so that the protrusion 15 is fitted into the depression 14.

Embodiment of Discharge Lamp Cold Cathode and Cold Cathode Discharge Lamp

Figure 12:
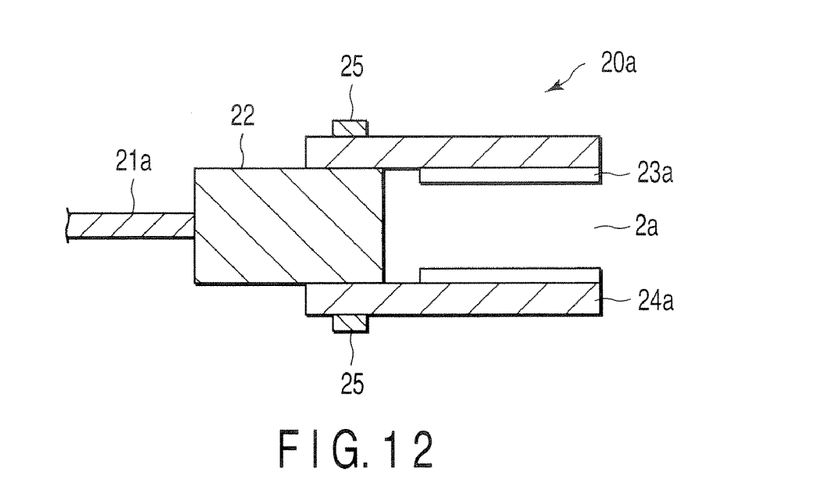
FIG. 12 is a schematic sectional view showing one example of a discharge lamp cold cathode produced by use of the metal material manufactured using the diamond film formation method.
Figure 13:
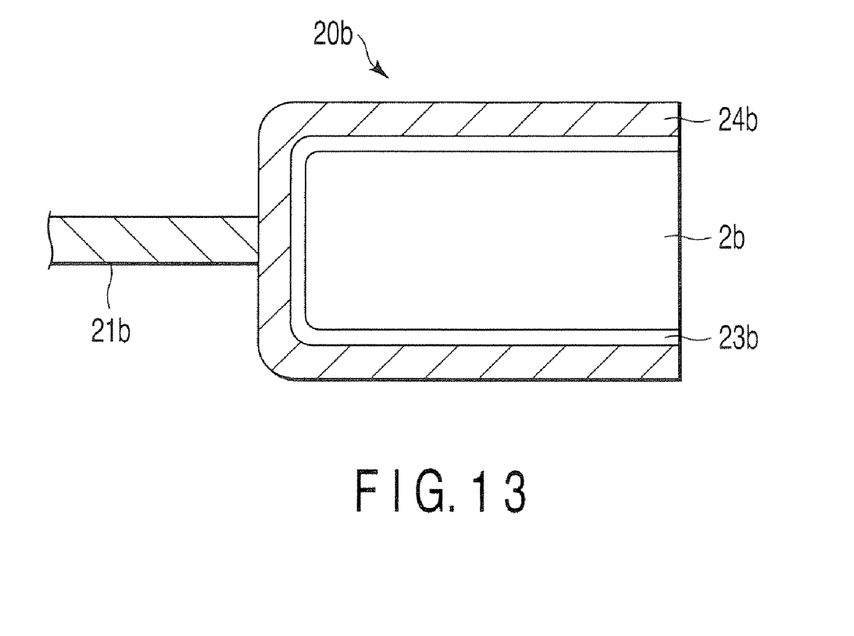
FIG. 13 is a schematic sectional view showing one example of a discharge lamp cold cathode produced by use of the metal material manufactured using the diamond film formation method.

A metal material manufactured using the diamond film formation method described above can be used for a cold cathode of a cold cathode discharge lamp. FIGS. 12 and 13 are schematic sectional views showing examples of the discharge lamp cold cathode produced by use of metal materials 1a and 1b manufactured using the diamond film formation method described above.

A cold cathode 20a shown in FIG. 12 is a cold cathode produced by use of the tubular metal material 1a shown in FIG. 1A. As shown in FIG. 12, the cold cathode 20a includes a metal rod 22 having a draw lead 21a for applying a voltage from the external and a metal material 24a with a diamond film 23a formed on an interior surface of an opening 2a, and the metal rod 22 and the metal material 24a are fixed by a joining member 25.

A cold cathode 20b shown in FIG. 13 is a cold cathode produced by use of the cup-shaped metal material 1b shown in FIG. 1B. As shown in FIG. 13, the cold cathode 20b includes a draw lead 21b for applying a voltage from the external and a metal material 24b with a diamond film 23b formed on an interior surface of an opening 2b, and the draw lead 21b and the metal material 24b are welded together.

The metal rod 22 is not specifically limited as long as it is made of a conductive material. In addition, an example is shown in the present embodiment where nickel is used. The joining member 25 is a member used to join and fix the metal rod 22 to the metal material 24a in a situation in which the metal rod 22 is attached to the metal material 24a.

Figure 14:
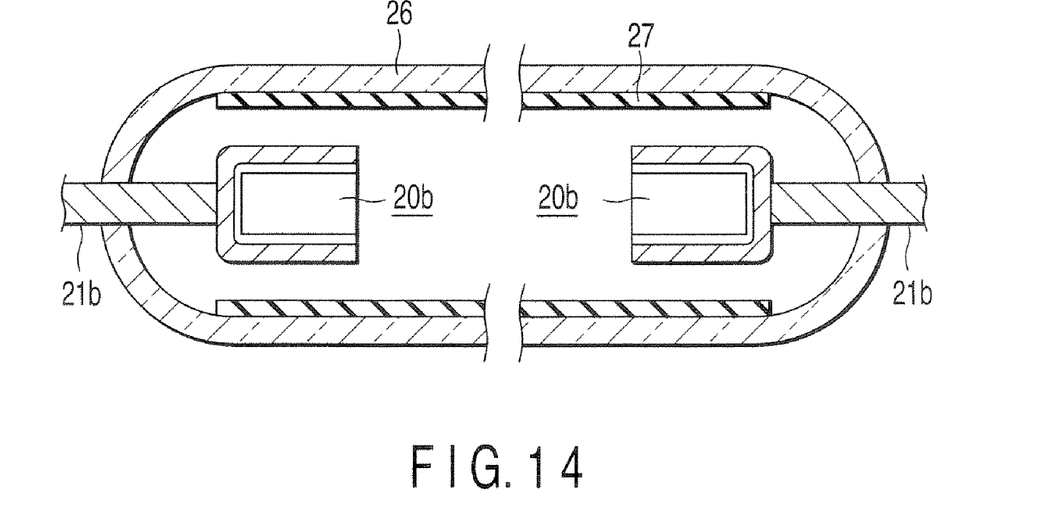
FIG. 14 is a conceptual diagram of a cold cathode discharge lamp when a cold cathode 20b shown in FIG. 13 is used as an electrode.

Next, the outline of the cold cathode discharge lamp will be described when the cold cathode described above is used for the cold cathode discharge lamp. FIG. 14 shows a conceptual diagram of the cold cathode discharge lamp when the cold cathode 20b shown in FIG. 13 is used as an electrode.

In the cold cathode discharge lamp shown in FIG. 14, a rare gas or the like containing a slight amount of mercury is sealed in a glass tube 26, and a fluorescent film 27 made of a phosphor generating visible light by ultraviolet rays is formed on an interior wall of the glass tube 26. Moreover, the cold cathodes 20b are provided at both ends of this glass tube 26.

The cold cathode 20b is composed of the metal material 24b made of molybdenum having a thickness of about 0.1 to 0.2 mm and a length of 2 to 4 mm, and the draw lead 21b electrically connected to the metal material 24b. The draw lead 21b is sealed at the end of the glass tube 26 over about 0.2 to 1.0 mm, and led to the outside of the glass tube 26, thereby serving as a feed lead wire. A required voltage is applied to the cold cathode 20b via the feed lead wire so that the cold cathode 20b functions as a discharging electrode.

Here, the glass tube 26 has an outside diameter of about 1.2 to 3.0 mm and a length of about 50 to 500 mm, and, for example, about 0.5 to 2.0 mg/cm$^3$ of mercury and about 8 to 20 kPa of a rare gas are sealed in the glass tube 26.

The inert gas referred to here represents a gas which is quite stable and which does not easily chemically combine with other elements, and includes, for example, helium (He), neon (Ne), argon (Ar), krypton (Kr), xenon (Xe) and radon (Rn).

This cold cathode 20b of the cold cathode discharge lamp starts discharging electricity when a high voltage is applied thereto from the external via the draw lead 21b. When the electric discharge is started, the ionized sealed gas such as the rare gas collides with the diamond thin film 23b forming an electric discharge surface of the cold cathode 20b, and electrons are released from the diamond thin film 23b by secondary electron emission. Further, a cycle is generated in which these electrons are accelerated to collide with atoms of the sealed gas and ionized. That is, such a cycle is generated so that the voltage necessary to sustain the electric discharge is lower than the voltage at a discharge starting point. Moreover, sealed mercury is excited by the collision with the electrons and the ionized or excited inert gas, and generates ultraviolet rays. These ultraviolet rays collide with the fluorescent film 27 to excite a fluorescent material of the fluorescent film 27 and generate visible light.

As described, in the cold cathode discharge lamp using the cold cathode in which the diamond thin film is formed, a discharge starting voltage and a discharge sustaining voltage are dropped by high efficiency of the secondary electron emission of diamond, and electric power necessary for power generation can be reduced, thereby improving light emission efficiency.

In addition, the cold cathode discharge lamp has been described in connection with the cold cathode 20b shown in FIG. 13, but it should be understood that similar effects are also provided when the cold cathode 20a shown in FIG. 12 is used.

The cold cathode discharge lamp shown in FIG. 14 is manufactured by use of the diamond film formation method according to the present invention as follows: a diamond film is formed on the interior surface of the opening 2b of the metal material 1b as shown in FIG. 2; the draw lead 21b is welded to the bottom of the metal material 1b in which the diamond film is formed, in order to produce a cold cathode; the cold cathode is attached in a sealed state to both ends of the glass tube 26 in which the fluorescent film 27 is applied to the inside thereof; air within the glass tube to which the cold cathode is attached in a sealed state is discharged; and a rare gas is then sealed therein.

A discharge lamp using an Mo electrode without a lining of diamond was experimentally produced as a comparative example, and was compared with the cold cathode discharge lamp shown in FIG. 14 in regard to their characteristics. As a result, the discharge sustaining voltage was about 150 V in the comparative example, but in the cold cathode discharge lamp shown in FIG. 14, the discharge sustaining voltage was 100 V or less in all cases and the lowest discharge sustaining voltage was about 70 V. Moreover, electric discharge was continuously performed for 1000 hours, but no specific characteristic deterioration was found.

As described above, according to the embodiments of the present invention, it is possible to suitably form a diamond film on the interior surface of the cup-shaped or tubular metal material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A diamond film formation method comprising:
forming, in a composite of a metal material and a semiconductor material, diamond nuclei on a surface of the metal material at a temperature below 650° C. in a first mixed gas containing at least carbon and hydrogen; and
growing the diamond nuclei formed in the composite at a temperature below 750° C. in a second mixed gas containing at least carbon and hydrogen to form a diamond film.

2. The method according to claim 1, wherein the diamond film is formed at an air pressure higher than an air pressure in said forming the diamond nuclei.

3. The method according to claim 1, wherein the first mixed gas contains methane gas and hydrogen gas.

4. The method according to claim 1, wherein the second mixed gas contains methane gas and hydrogen gas.

5. The method according to claim 4, wherein the second mixed gas further contains at least one selected from the group consisting of trimethyl borate, diborane and trimethylboron.

6. The method according to claim 1, wherein the second mixed gas contains a mixed gas of either acetone or methyl alcohol and hydrogen gas.

7. The method according to claim 6, wherein at least one selected from the group consisting of trimethyl borate, diborane and trimethylboron is further introduced into the second mixed gas.

8. The method according to claim 1, wherein the metal material contains at least one selected from the group consisting of molybdenum, tungsten, cobalt and nickel.

9. A diamond film formation method comprising:
by providing a semiconductor material on an opening edge on one surface of a metal material in which an opening is formed, forming diamond nuclei on an interior surface of the opening at a temperature below 650° C. in a first mixed gas containing at least carbon and hydrogen; and
growing the diamond nuclei formed on the metal material at a temperature below 750° C. in a second mixed gas containing at least carbon and hydrogen to form a diamond film.

10. The method according to claim 9, wherein the diamond film is formed at an air pressure higher than an air pressure in said forming the diamond nuclei.

11. The method according to claim 9, wherein the first mixed gas contains methane gas and hydrogen gas.

12. The method according to claim 9, wherein the second mixed gas contains methane gas and hydrogen gas.

13. The method according to claim 12, wherein the second mixed gas further contains at least one selected from the group consisting of trimethyl borate, diborane and trimethylboron.

14. The method according to claim 9, wherein the second mixed gas contains a mixed gas of either acetone or methyl alcohol and hydrogen gas.

15. The method according to claim 14, wherein at least one selected from the group consisting of trimethyl borate, diborane and trimethylboron is further introduced into the second mixed gas.

16. The method according to claim 9, wherein the metal material contains at least one selected from the group consisting of molybdenum, tungsten, cobalt and nickel.

* * * * *